(12) United States Patent
Quiroga et al.

(10) Patent No.: US 10,698,231 B2
(45) Date of Patent: Jun. 30, 2020

(54) CREATING REWRITABLE LENSES

(71) Applicant: Indizen Optical Technologies of America, LLC, Torrance, CA (US)

(72) Inventors: Juan Antonio Quiroga, Madrid (ES); Ignacio Canga, Madrid (ES); Jose Alonso, Madrid (ES); Daniel Crespo, Torrance, CA (US)

(73) Assignee: Indizen Optical Technologies of America, LLC, Torrance, CA (US)

( * ) Notice: Subject to any disclaimer, the term of this patent is extended or adjusted under 35 U.S.C. 154(b) by 209 days.

(21) Appl. No.: 15/899,999

(22) Filed: Feb. 20, 2018

(65) Prior Publication Data

US 2019/0258080 A1    Aug. 22, 2019

(51) Int. Cl.
| | | |
|---|---|---|
| G02C 7/02 | (2006.01) | |
| B29D 11/00 | (2006.01) | |
| G03F 7/00 | (2006.01) | |
| G02C 7/06 | (2006.01) | |
| G03F 7/20 | (2006.01) | |

(52) U.S. Cl.
CPC ........ *G02C 7/022* (2013.01); *B29D 11/00009* (2013.01); *G02C 7/06* (2013.01); *G03F 7/001* (2013.01); *G03F 7/2051* (2013.01); *G02C 2202/12* (2013.01)

(58) Field of Classification Search
CPC .......... G02C 7/022; G02C 7/06; G03F 7/001; G03F 7/2051; B29D 11/00028
See application file for complete search history.

(56) References Cited

U.S. PATENT DOCUMENTS

| | | |
|---|---|---|
| 4,919,520 A | 4/1990 | Okada et al. |
| 5,384,067 A | 1/1995 | Doane et al. |
| 5,528,401 A | 6/1996 | Narutaki et al. |
| 6,433,850 B2 | 8/2002 | Reznikov et al. |
| 7,071,255 B2 | 7/2006 | Nishimura et al. |
| 7,728,949 B2 | 6/2010 | Clarke et al. |
| 7,971,994 B2 | 7/2011 | Blum et al. |
| 9,726,907 B2 | 8/2017 | Quiroga et al. |
| 2006/0192918 A1 | 8/2006 | Blum |

(Continued)

FOREIGN PATENT DOCUMENTS

| | | |
|---|---|---|
| WO | 2014172712 A2 | 10/2014 |
| WO | 2016073446 A1 | 5/2016 |

OTHER PUBLICATIONS

World Intellectual Property Organization, International Search Report for International Application No. PCT/US2019/018342, dated May 1, 2019, 9 pages.

(Continued)

*Primary Examiner* — Mathieu D Vargot
(74) *Attorney, Agent, or Firm* — SoCal IP Law Group LLP; Mark Andrew Goldstein (57) ABSTRACT

Methods for lens configuration are disclosed. A method includes erasing a lens by heating the lens to a defined erasure temperature and writing a refractive index spatial distribution in the lens using an exposure pattern of directed ultraviolet (UV) light. The lens may be used as an ophthalmic lens or a lens used in industry. The lens comprises a rewriteable material, including, for example, liquid crystals. The lens may be erased using heat of a defined temperature. The lens may be rewritten by applying other exposure patterns to the lens using UV light.

21 Claims, 9 Drawing Sheets

(56) References Cited

U.S. PATENT DOCUMENTS

2016/0377886 A1 12/2016 Quiroga et al.

OTHER PUBLICATIONS

Cheng et al., "Electrically switchable and optically rewritable reflective Fresnel zone plate in dye-doped cholesteric liquid crystals", Optics Express, vol. 15, Issue 21, pp. 14078-14085, published Oct. 17, 2007, total of 8 pages.

Chigrinov et al., "Photoalignment of Liquid Crystalline Materials: Physics and Applications", Wiley Series in Display Technology, http://books.google.com/books?id=Luj2fdmpqxoC, last accessed Feb. 22, 2018.

David Coates, "Liquid Crystals—Applications and Uses", vol. 1, published Sep. 1990, 10.1142/9789814368278_0008, last accessed Feb. 22, 2018.

Fischer, "Gradient-index ophthalmic lens design and polymer material studies", ProQuest Dissertations and Theses; Thesis (Ph.D.)—University of Rochester, 2002.; Publication No. AAI3061199; ISBN: 9780493769189; Source: Dissertation Abstracts International, vol. 63-08, Section: B, http://adsabs.harvard.edu/abs/2002PhDT...45F, last accessed Feb. 22, 2018.

Hsu et al., "Controlling liquid crystal pretilt angle with photocurable prepolymer and vertically aligned substrate", Optics Express vol. 24, Issue 2, pp. 1463-1471 (2016), https://doi.org/10.1364/OE.24.001463, last accessed Feb. 22, 2018, 9 total pages.

Jeng et al., "Controlling the alignment of liquid crystals by nanoparticle-doped and UV-treated polyimide alignment films", Proceedings vol. 8279, Emerging Liquid Crystal Technologies VII; 827912 (2012); doi: 10.1117/12.912827, Published Feb. 11, 2012.

Kim et al., "Effects of Surface Polarity on Nematic Liquid Crystal Alignment", vol. 45, San Diego, CA, Jun. 1-6, 2014, DOI: 10.1002/j.2168-0159.2014.tb00248.x, last accessed Feb. 22, 2018.

Nemoto et al., "Anchoring and alignment in a liquid crystal cell: self-alignment of homogeneous nematic", first published on Sep. 21, 2012, Soft Matter 8 (45). Royal Society of Chemistry (RSC): 11526. doi:10.1039/c2sm26501j.

Sun, J, A K Srivastava, L Wang, V G Chigrinov, and H S Kwok. 2013. "Optically Tunable and Rewritable Diffraction Grating with Photoaligned Liquid Crystals." Optics Letters 38 (13). Optical Society of America: 2342-44. doi:10.1364/OL.38.002342.

CREATING REWRITABLE LENSES

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to the field of optics. In particular, this disclosure relates to lenses having modifiable, rewritable features.

Description of the Related Art

Ophthalmic lenses are designed to provide corrective optical power to improve sight by correcting for aberrations or optical defects in the eye. They enhance quality of life by improving visual performance. Fixed power ophthalmic lenses have been known for years, and technical advancements allow them to correct errors in vision more precisely. However, the needed visual correction for an individual changes over time due to age-related physiological changes, such as the onset and progression of presbyopia. In addition, an individual's needed correction may change due to stress, illness, accident, medical treatments, environmental conditions, and personal preferences. Thus, there is a need for lenses that allow optical power to be varied either in its total value and/or in the power distribution or placement on the lens.

Similarly lenses are used in science and industry for many purposes including in or as light guides, retardation plates, beam shapers, telescopes, microscopes, etc. Here, as with ophthalmic lenses, when there are changing requirements, the lens has historically been replaced. This many include or require unmounting and remounting a lens. This results in increased costs from acquiring a lens meeting new requirements as well as the uninstallation and reinstallation of the lens, which, depending on the application may not be easy. Thus, there is a need for lenses that allow optical power to be varied either in its total value and/or in the power distribution or placement on the lens, either independent of an installed location or in an installed state.

DETAILED DESCRIPTION

New and innovative applications of liquid crystals may be used to create rewriteable lenses to address the changing needs of lens wearers and lens users. The method described herein details how to make rewritable lenses that allow for lens reconfiguration for modification and reuse. The lenses described herein allow for reuse of an existing lens. This reuse reduces physical product waste. Plus, the rewritable lens described herein can quickly be reconfigured or rewritten which results in greater customer satisfaction. For example, if a user has lenses made according to an ophthalmic prescription, when the patient's prescription changes, the lenses may be rewritten to conform to new, more recent ophthalmic prescription. For example, if in an industrial, lab or technical environment, a lens can be rewritten to meet new lens property requirements.

The methods presented herein are based in the use of liquid crystals. The lenses described herein are made from liquid crystals. The term "liquid crystal" is referred to herein as LC. The lens may be constructed from and include both a rewriteable material and a passive, unchangeable material. The passive material is optional. The rewritable material is made from LCs. The LC based materials used for the lenses described herein include polymer dispersed liquid crystal, a polymer stabilized liquid crystal, an encapsulated liquid crystal, a bistable liquid crystal, a polymer dispersed bistable liquid crystal, a polymer stabilized bistable liquid crystal, an encapsulated bistable liquid crystal. The LCs used in preparing the lens described herein may be LC mixtures having heat reversible Exposure-Induced Polar Alignment (EPA). In some implementations, for example, LCs MLC2132, MLC2171, or MLC2172 available from Merck KGaA of Darmstadt, Germany; LCs QYPDLC-142 and QYTN802 from Qingdao QY Liquid Crystal Co., Ltd. of Shandong, China; or LC 5CB from SYNTHON Chemicals GmbH & Co. KG of Wolfen, Germany are used. MLC2132, MLC2171, or MLC2172 are mixtures of LCs that have the heat reversible Exposure-Induced Polar Alignment (EPA). QYPDLC-142, QYTN802 and 5CB LCs are mixed with an extra component which adds the EPA property to the LC. The extra component which is added is a high birefringence biphenyl tolane LC monomer with high response to UV light. When the "non-EPA" LCs such as, for example, QYPDLC-142, QYTN802 and 5CB are mixed with the biphenyl tolane LC monomers, the EPA activity appears with UV exposure. Examples of these components are PT3F, PT401 and PT502 liquid crystal monomers from LCC Corporation, Fujiyoshida City, Japan.

As used herein, the term "writable" means that the lens can be written or configured with particular optical properties. The term "rewritable" indicates that the lens can have optical properties written to it, and then the optical properties of the lens can be changed multiple times. The rewritable lenses described herein do not require any external or physical modifications such as grinding, cutting or shaping of the lens. The rewritable lenses described herein remain stable and maintain the optical properties written to them at common temperatures and under typical lighting and use conditions. This is distinct from materials that revert to a previous state or a rest state when an energy source is removed. That is, according to the methods described herein, after a rewritable lens had been configured, the optical properties of the lens remain constant and do not change. When the rewritable lens is used on ophthalmic lenses, after a rewritable lens had been configured (or reconfigured), the optical properties of the lens remain constant and do not change when worn or used by a patient. In this example, the ophthalmic lenses may be for eyeglasses or may be intraocular lenses. The rewritable lenses described herein are particularly useful with implanted intraocular lenses as the need for additional surgery is alleviated by the ability to achieve in-eye reconfiguration of the rewriteable intraocular lens. When the rewritable lens is used in a technical environment or as "in place" lenses, such as, for example with cameras, microscopes, telescopes, light houses, waveguides, retardation plates, and others, after a rewritable lens had been configured (or reconfigured), the optical properties of the lens remain constant and do not change when used in their technical environment or in place location.

The rewriteable lenses may be written or rewritten when exposed to an exposure pattern of visible or non-visible light. In one embodiment, UV light is used. Exposure is the product of irradiance by time, and the refraction index change is a function of the exposure at every point. The relation between exposure and refractive index is calibrated for the particular LC material used. The exposure pattern includes combinations of lengths of time and UV Irradiance for a plurality of locations in the lens. For example, an exposure H=10 J/cm² can be obtained using an irradiance E=10 W/cm² for time t=1 second or, in another example, the exposure can be obtained by an irradiance E=1 W/cm² for time t=10 seconds. In both examples, the exposure H=E*t=10 J/cm². Further examples are explained below.

The rewriteable lenses may be erased (that is, returned to an original or clear state) when exposed to heat. To erase the lens using heat, the lens must reach a defined erasure temperature to be erased. That is, the lens is heated to the defined erasure temperature. The defined erasure temperate is a single value in the range of 70 to 130 degrees (inclusive) centigrade. For example, in some embodiments, the defined erasure temperature is 70, 92, 130, 75, 86 or 78 degrees centigrade. To reach this defined temperature, the lens may be heated in oven or exposed to hot air, so long as the lens reaches the needed defined erasure temperature. In addition to hot air, infrared radiation can be used to heat the lens to the defined erasure temperature.

The methods described herein use liquid crystal (LC) based material to create and rewrite lenses, and, in particular, gradient index or GRIN lenses, by changing the refractive index spatial distribution. The optical properties that may be written to or configured to a lens according to the techniques described herein include refractive index, birefringence and dioptric power, including sphere, cylinder, axis orientation, prism and other vision correcting attributes. These optical properties may be graded, stepped or positioned in the lens, and may affect all or only part of a viewing or using region of the lens. If more than one optical property is writable, each such property may be written (and rewritten) in one or more areas of the lens, and various combinations of the writable optical properties may exist in different regions of the lens. All of the changes are made without physically changing the external surface or outer portions of the lens. Rather, the refractive index of the lens material is changed by use of a UV beam.

Figure 1:
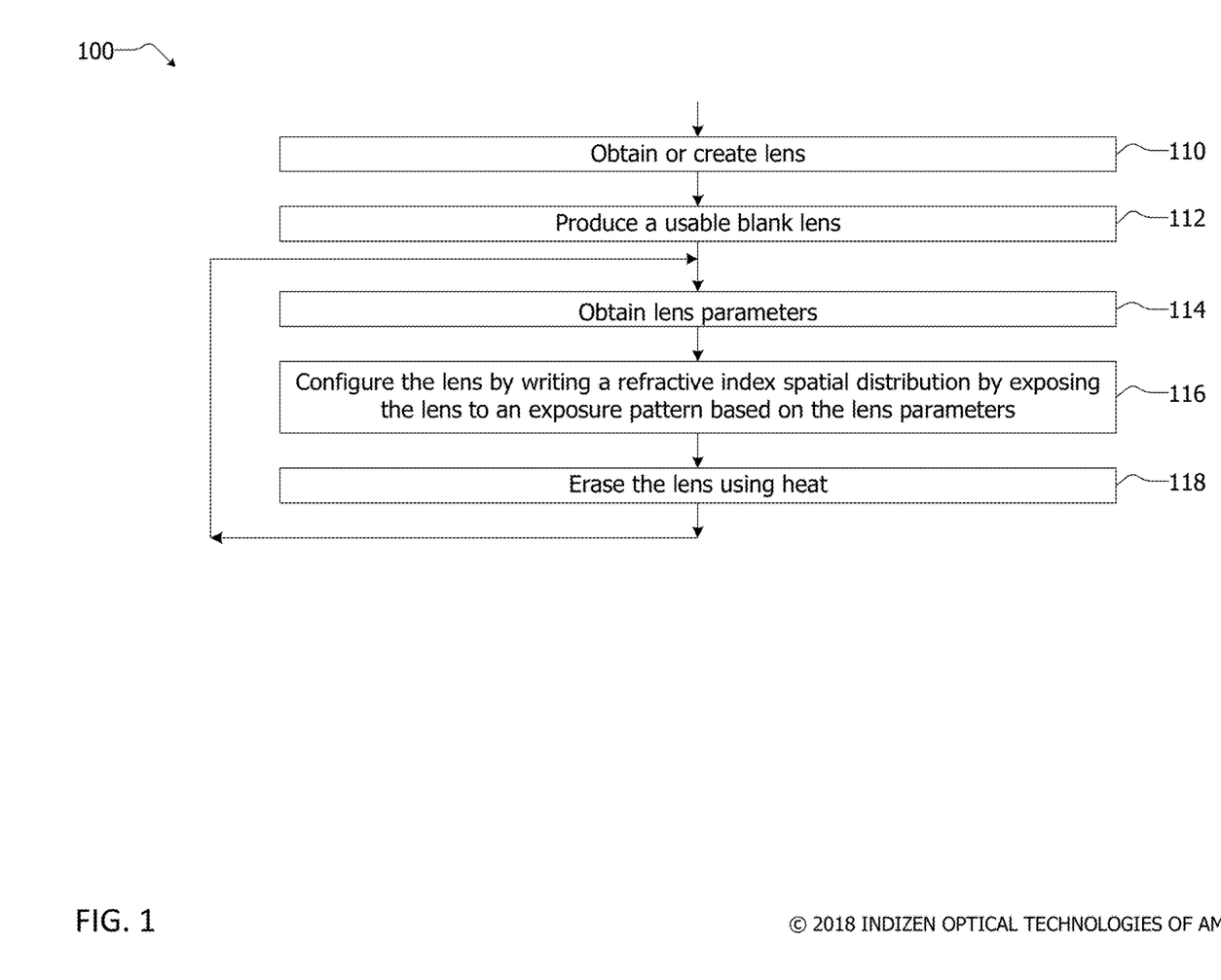
FIG. 1 is a flow chart of actions taken to create and rewrite a rewriteable lens.
Figure 4A:
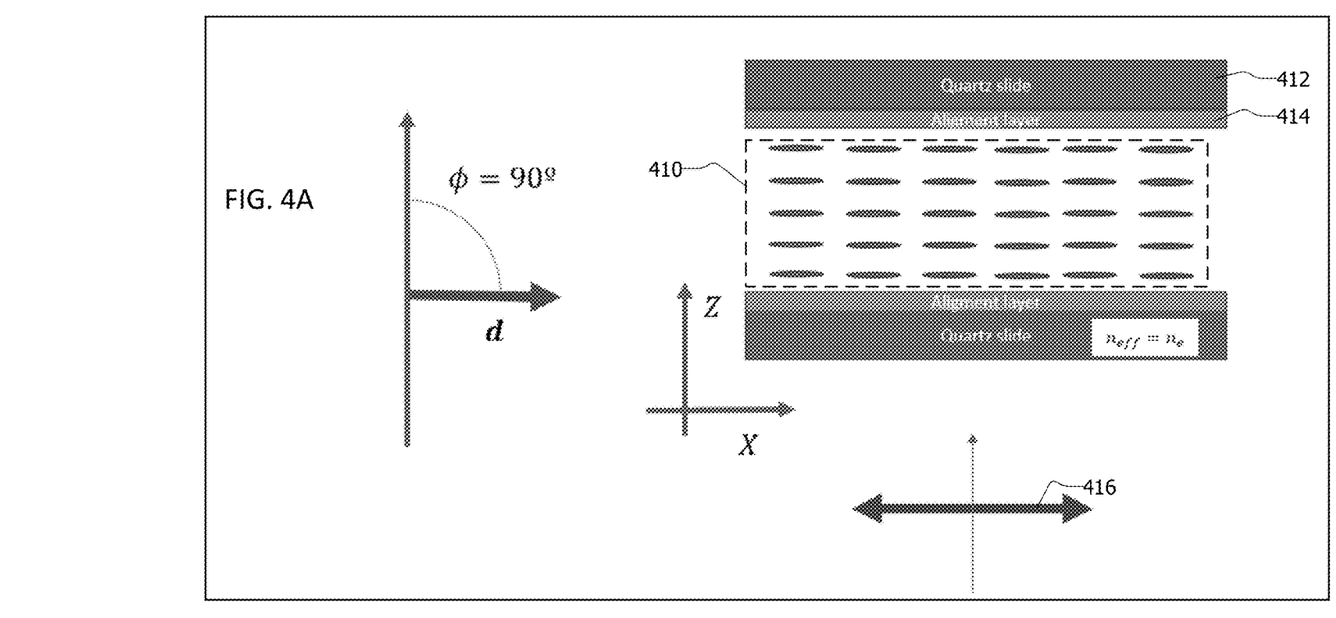
FIG. 4A is a block diagram of liquid crystal in a rewriteable lens after initial creation.

Referring now to FIG. 1, a flow chart of the actions in a method for lens creation and configuration is shown. First a lens is obtained or created, as shown in block 110. A usable blank lens is then created, as shown in block 112. This may be achieved using heat or UV light to erase or clear the lens. For example, in one implementation, a lens is created by placing LC material between quartz slides or in a quartz, glass or plastic container. The container is configured and sized to fit a particular ophthalmic or technical application. The lens itself may be created according to the methods described in US Patent Publication US20160377886. The LC material is then aligned to form a homogenous cell. The alignment is important. In one embodiment, a magnetic field is applied to align the LC material. This produces a homogeneous cell with the director aligned horizontally having azimuthal and polar angles θ=0 and φ=90°, respectively, as shown in FIG. 4A.

Lens parameters are obtained, as shown in block 114. The lens parameters include values for near power, far power and prism, and may also additionally include one or more lens design values for progression profile, corridor length, position of the start of a progression, position of the end of the progression, distribution of fields in far and near regions, distribution of astigmatism in astigmatic lobes, maximum value of unwanted astigmatism, distribution of inset, and others. In an ophthalmic implementation, the lens parameters may be provided in and/or derived from an ophthalmic lens prescription. The lens is configured according to the lens parameters by writing a refractive index spatial distribution by exposing the lens to an exposure pattern based on the lens parameters, as shown in block 116. The exposure pattern may be written, in one embodiment, using ultraviolet (UV) light. The lens may be reconfigured in this same way, such that a current refractive index can be altered, modified or otherwise changed in a large or small way to conform to new requirements by applying UV light according to an exposure pattern to configure the lens according to a different refractive index. The lens may be erased using heat, as shown in block 118. In other embodiments, infrared radiation may be used to heat the lens.

Figure 2:
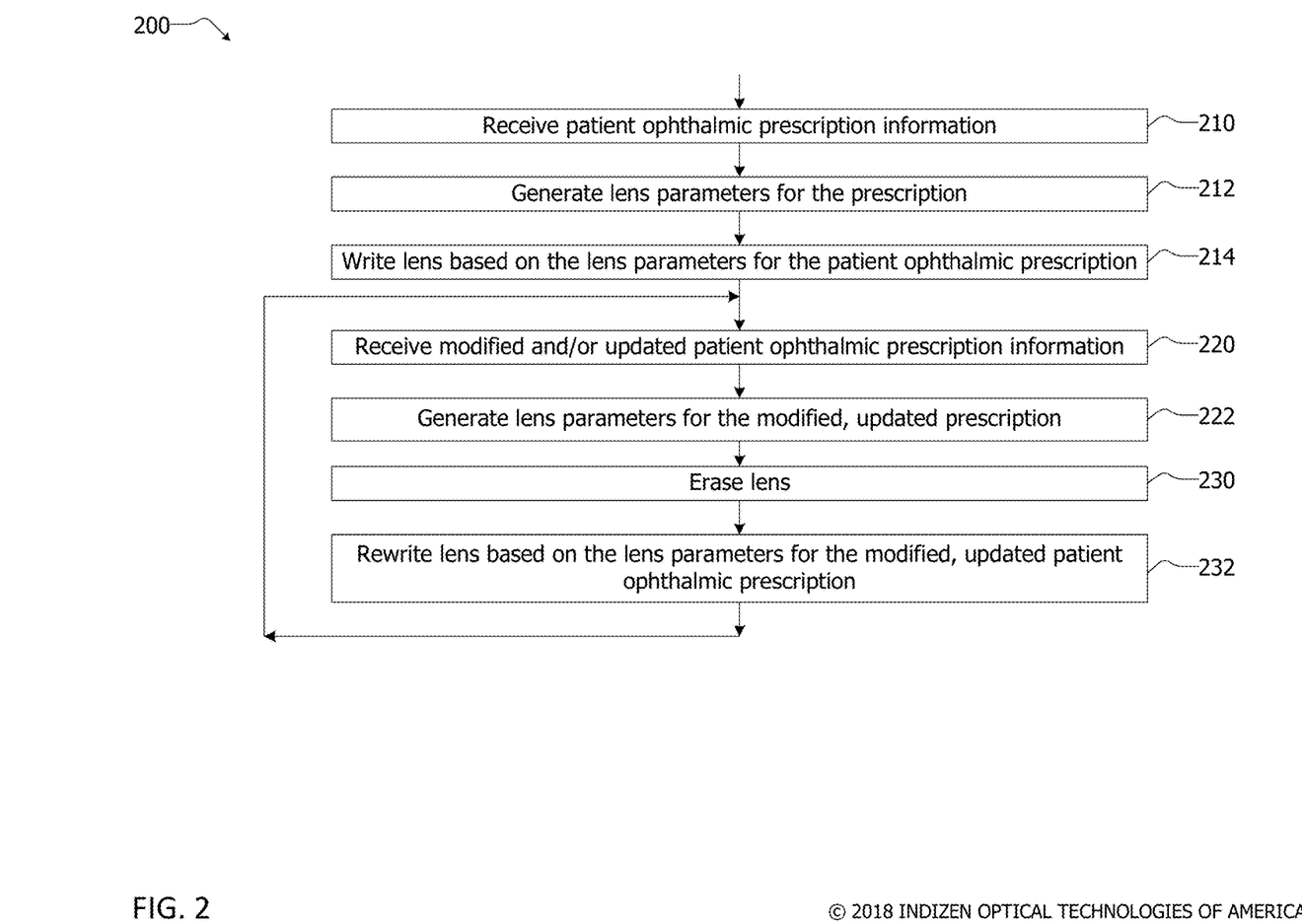
FIG. 2 is a flow chart of actions taken to create and rewrite a rewriteable ophthalmic lens when a prescription changes, including erasing the lens.

Referring now to FIG. 2, there is shown a flow chart of actions taken to create and rewrite a rewriteable ophthalmic lens when a prescription changes, including erasing the lens. This method may be used on technical or other lenses when the demands or requirements of the refractive index of the lens change. When used in the ophthalmic context, the rewriteable lens may be used as spectacle lenses, face shields, eye shields, goggles, insert lenses, lenses for respirators, lenses for helmets, intraocular lenses, refractive lenses and diffractive lenses. Referring to FIG. 2, patient ophthalmic prescription information is received, as shown in block 210. The ophthalmic prescription may be received on paper and then the information input into a computer system or may be transmitted by computer communication. Lens parameters for the prescription are then generated, as shown in block 212. The lens is then written based on the lens parameters for the patient ophthalmic prescription, as shown in block 214. Specifically, a refractive index spatial distribution is written to the lens by exposing the lens to an exposure pattern based on the lens parameters. The exposure pattern is generated using ultraviolet (UV) light. Typically, at some time later, such as at an annual or other ophthalmic examination, an updated or modified patient ophthalmic prescription is obtained. The modified or updated patient ophthalmic prescription information is received, as shown in block 220. Lens parameters for the modified, updated prescription are generated based on the modified, updated ophthalmic prescription, as shown in block 222. In this embodiment, the lens is erased, as shown in block 230. The erasing is achieved with heat or infrared radiation. The lens is then rewritten based on the lens parameters for the modified, updated patient ophthalmic prescription, as shown in block 232. Specifically, a refractive index spatial distribution is written to the lens by exposing the lens to an exposure pattern based on the lens parameters derived from the lens parameters for the modified, updated patient ophthalmic prescription. The exposure pattern is generated using ultraviolet (UV) light.

Figure 3:
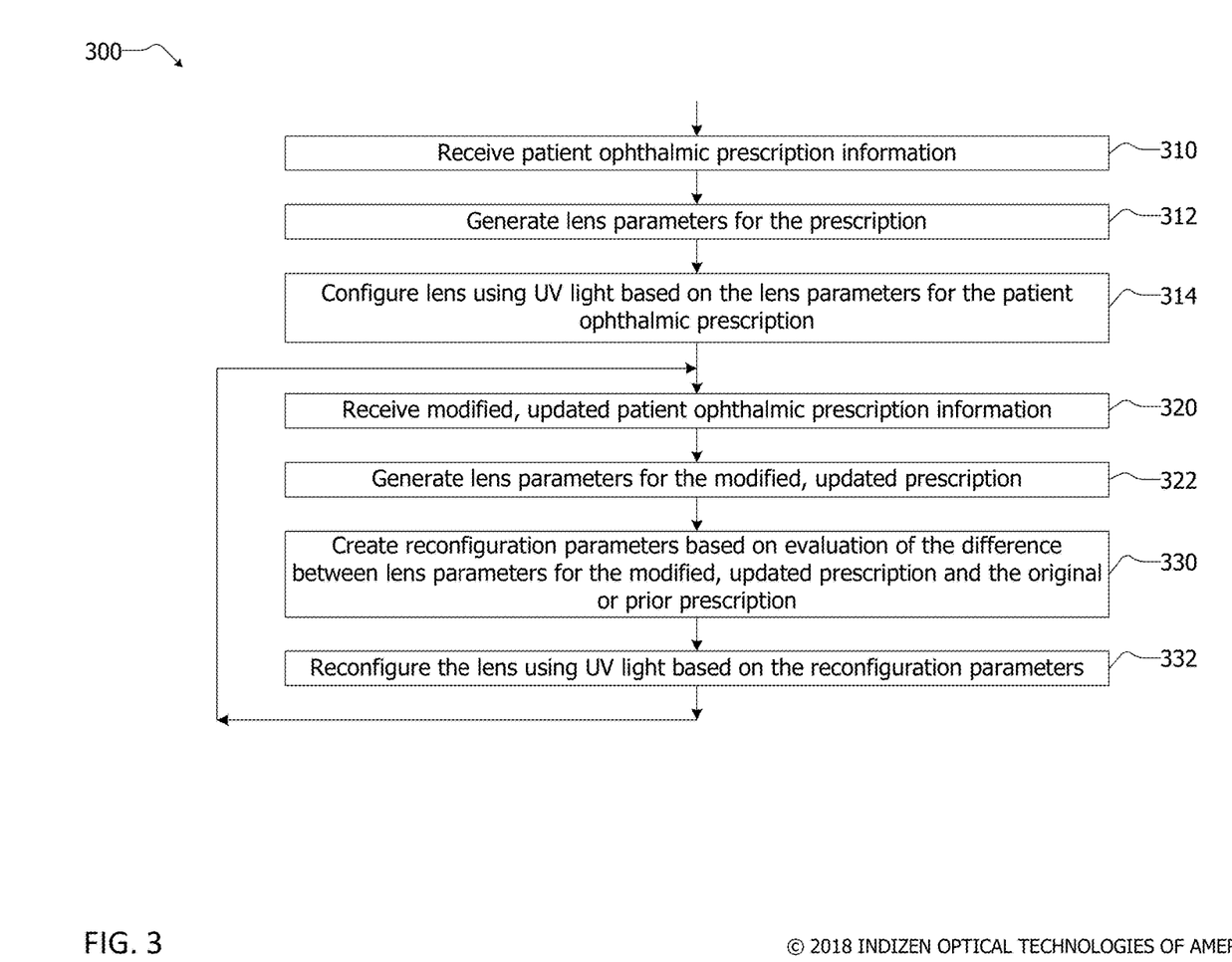
FIG. 3 is a flow chart of actions taken to configure and reconfigure a rewriteable ophthalmic lens when a prescription changes.

Referring now to FIG. 3, there is shown a flow chart of actions taken to configure and reconfigure a rewriteable ophthalmic lens when a prescription changes. This same method may be used on technical or other lenses when the demands or requirements of the refractive index of the lens change. Referring to FIG. 3, patient ophthalmic prescription information is received, as shown in block 310. The ophthalmic prescription may be received on paper and then the information input into a computer system or may be transmitted by computer communication. Lens parameters for the prescription are then generated, as shown in block 312. The lens is then configured using UV light based on the lens parameters for the patient ophthalmic prescription, as shown in block 314. Specifically, a refractive index spatial distribution is written to the lens by exposing the lens to an exposure pattern based on the lens parameters. The exposure pattern is written using ultraviolet (UV) light. Typically, at some time later, such as at an annual or other ophthalmic examination, an updated or modified patient ophthalmic prescription is obtained. The modified or updated patient ophthalmic prescription information is received, as shown in block 320. Lens parameters for the modified, updated prescription are generated based on the modified, updated ophthalmic prescription, as shown in block 322. In this embodiment, reconfiguration parameters are generated based on evaluation of the difference between the modified updated prescription and the original or prior prescription, as shown in block 330. The lens is reconfigured using UV light based on the reconfiguration parameters. This is achieved with heat or using UV light. The lens is reconfigured by writing limited portions of a refractive index spatial distribution to the lens by exposing the lens to a limited portion exposure pattern based on the reconfiguration parameters. The limited portion exposure pattern is written using ultraviolet (UV) light.

The lenses described herein include LC cells built using UV grade fused silica (quartz) slides from AdValue Inc. The UV source may be any high power plasma light, such as, for example, High-Power Plasma Light Source model HPLS343 from Thorlabs Inc, of Newton, N.J. The white light spectrum produced by the lamp in the high plasma light may be filtered. In one configuration, the light is filtered with a bandpass UV filter model FGUV11M (from Thorlabs Inc, of Newton, N.J.) having bandpass region 275-375 nm and a peak transmission at 325 nm. The plasma light source is focused so that the typical irradiance on the LC lens is $E=100$ mW/cm$^2$.

To write to the lens, a UV source emitting bellow 385 nm with sufficient optical power is used. The smaller the wavelength, the more efficient the writing process. A wavelength of 365 nm is recommended in some implementations because it is the smaller wavelength achievable by solid state emitters which have lower cost and greater optical power. For example, devices like the Luminus CBM-40-UV LED from Luminus, Inc of Sunnyvale, Calif. with the emission peak at 365 nm and a bandwidth of about 30 nm may be used. This UV LED has 12 W output optical power that when focused allows for an irradiance of $E=2$ W/cm$^2$.

In one version of the method, with respect to exposures and times, when using 50 μm gap liquid crystal cells filled with MLC-2132, an exposure of $H=100\text{-}120$ J/cm$^2$ is applied to rotate the LC director from 90 to 0°, referred to as H90. This rotation implies a change in the refractive index from $n_e$ to $n_0$ and is the basis of the writing process. The value for H90 determines the time necessary to write the desired refractive index to a sample. In one example implementation, when $H90=100$ J/cm$^2$, for a system consisting in the plasma light UV source+UV bandpass filter (for example, the Thorlabs configuration described above) with an irradiance of $E=0.1$ W/cm$^2$, the writing process requires a time $$t = \frac{100 \text{ J/cm}^2}{0.1 \text{ W/cm}^2} = 1000 \text{ s}$$

at one point. In another example implementation, when a UV LED source is used (for example, the Luminus configuration described above) with an irradiance of $E=2$ W/cm$^2$ a time of $$t = \frac{100 \text{ J\textbackslash cm}^2}{2 \text{ W/cm}^2} = 10 \text{ s}$$

is required for the same writing process.

Figure 4B:
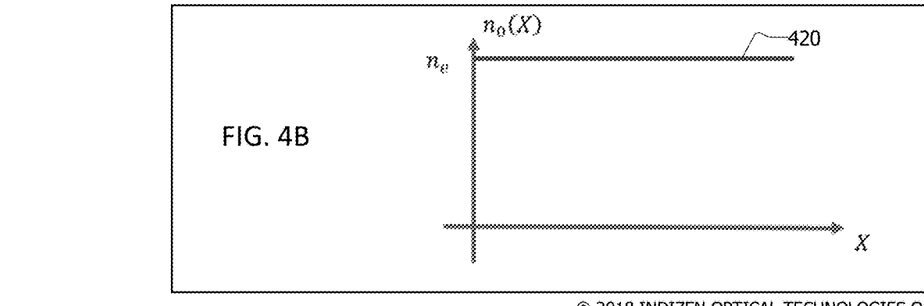
FIG. 4B is a graph showing the initial spatial index distribution of the liquid crystal lens in FIG. 4A.

Referring now to FIGS. 4A, 5A, 6A and 7A, the state of the gradient index (GRIN) LC lens is shown at the stages of the methods shown in and described regarding FIGS. 1, 2 and 3. Initially, after the lens is created as in block 110, a usable blank lens is created as shown in block 112 of FIG. 1. The LC cell is constructed using a LC material 410 confined between two Quartz slides 412 coated with a PMMA alignment layer 414. This lens in an initial state is shown in FIG. 4A. In the example shown, the polar angle of the LC director is 90° (labelled d) for all positions and the effective refractive index is $n_{eff}=n_e$ for the whole LC lens. The polar angle φ of the LC director d is zero for the lens. The effective index is $n_e$ in this example because linearly polarized light is used with the azimuth orientated in the X direction (indicated by the arrow 416 showing the polarization state). For embodiments using liquid crystal dispersions, polarized light is not necessary, rather, natural light is used. FIG. 4B is a graph showing the spatial index distribution 420 of the liquid crystal lens in FIG. 4A. The initial spatial index distribution $n_0(X)$ is constant, as the lens is blank.

Figure 5A:
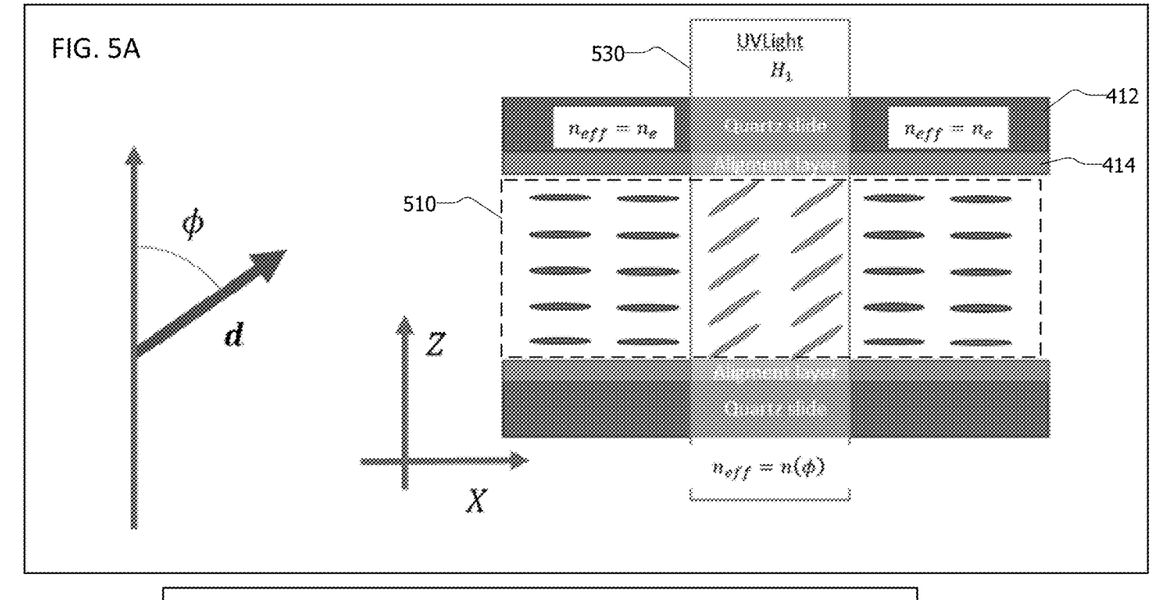
FIG. 5A is a block diagram of liquid crystal in a rewriteable lens in an intermediate state after application of ultraviolet light to a portion of the lens.
Figure 5B:
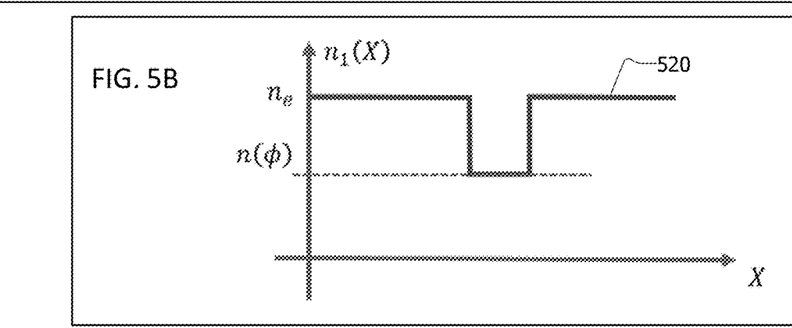
FIG. 5B is a graph showing the spatial index distribution of the liquid crystal lens in FIG. 5A.

Referring now to FIG. 5A, there is shown a block diagram of liquid crystal in a rewriteable lens after application of ultraviolet light to a portion of the lens in an intermediate state. After exposing the marked section of the lens to UV light with exposure $H_1$ the polar angle of the LC director in the irradiated area of the lens changes such that the refractive index changes in that area to an intermediate value n(φ). That is, in the UV exposed section 530 of the LC material 510 the polar angle of the director d changes from 90 to a given value, φ. However, the index of the section to the left and to the right of the irradiated area 530 remains the same than in the initial state. The result is a LC lens with a spatially dependent refractive index $n_1(X)$ reflected in the graph shown in FIG. 5B that constitutes a Gradient Index (GRIN) lens. With the appropriate index distribution, a desired lens prescription can be created using this method.

Figure 6A:
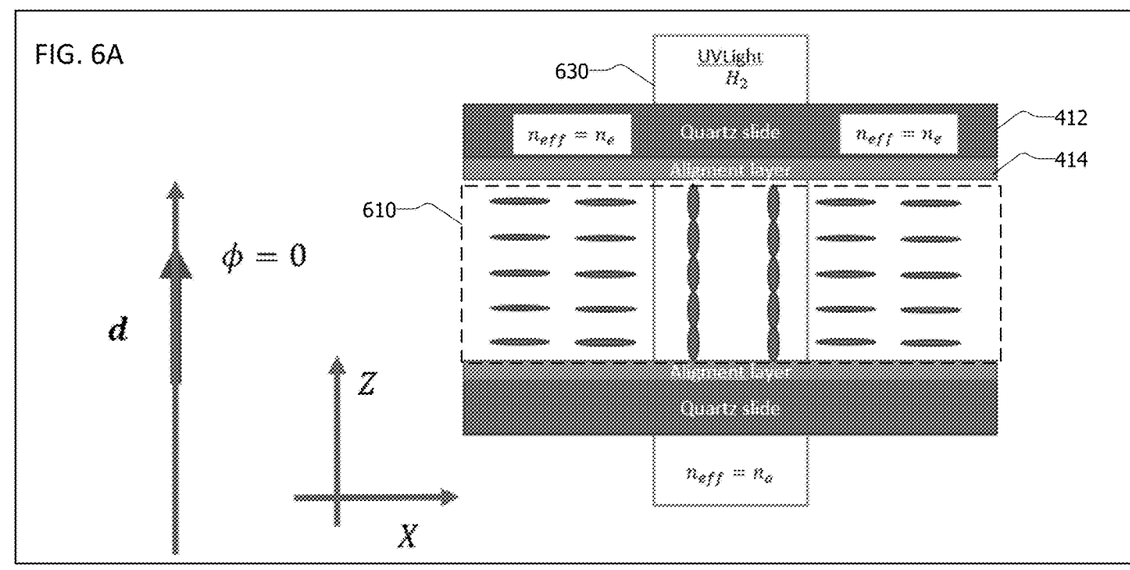
FIG. 6A is a block diagram of liquid crystal in a rewriteable lens after application of ultraviolet light to a portion of the lens to configure the lens.
Figure 6B:
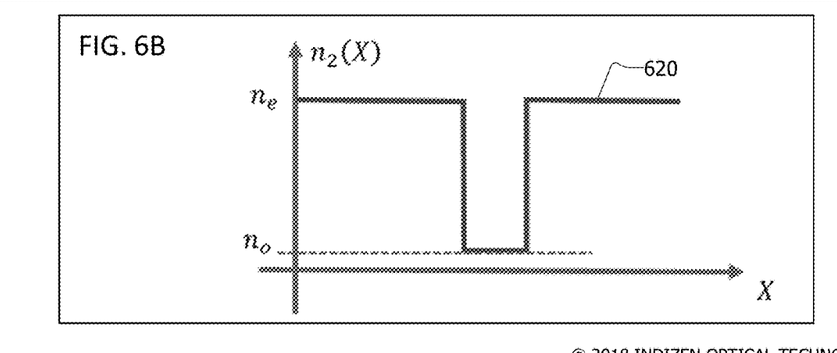
FIG. 6B is a graph showing the spatial index distribution of the liquid crystal lens in FIG. 6A.

Referring now to FIG. 6A, there is shown block diagram of liquid crystal in a rewriteable lens after application of ultraviolet light to a portion of the lens to configure the lens. When the exposure is large enough, $H_2$, the polar angle of the LC director may reach 0° and the effective refractive index for the irradiated area changes to $n_{eff}=n_o$. This will be the maximum change for the refractive index. As shown in FIG. 6A there is a refractive index of $n_o$ inside the irradiated area 630 of the LC material 610 and $n_e$ outside. The new spatial distribution of refractive index $n_2(X)$ is different than $n_1(X)$, and the GRIN lens generated in this way will be different from the one shown in FIG. 5A. This is how the lens is configured as described regarding block 116 of FIG. 1 and block 232 of FIG. 2. FIG. 6B is a graph showing the spatial index distribution 620 of the liquid crystal lens in FIG. 6A. The spatial index distribution 620 is the refractive index $n_2(X)$.

Figure 7A:
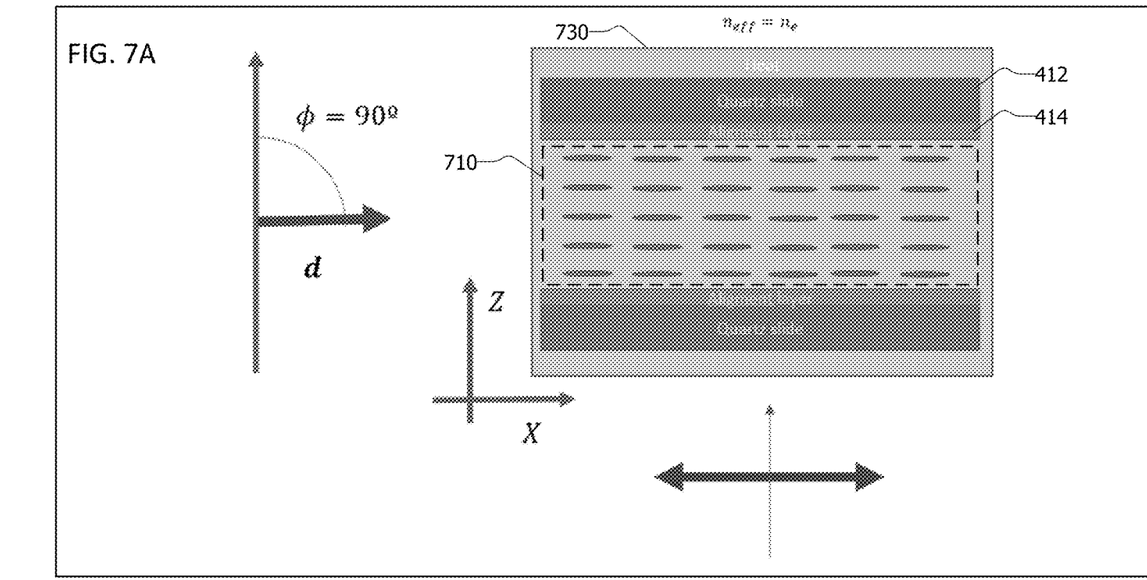
FIG. 7A is a block diagram of liquid crystal in a rewriteable lens after application of heat to the lens to erase the lens.
Figure 7B:
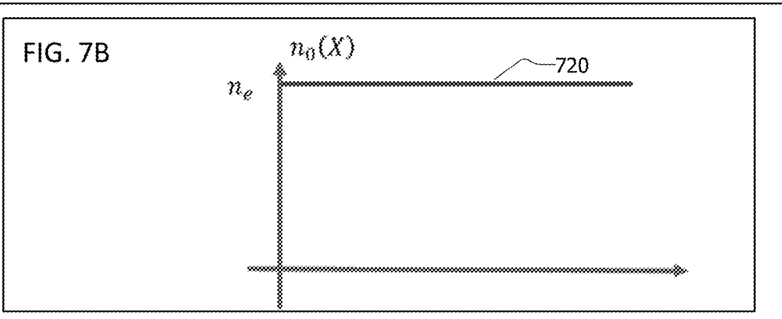
FIG. 7B is a graph showing the spatial index distribution of the liquid crystal lens in FIG. 7A.
Figure 8A:
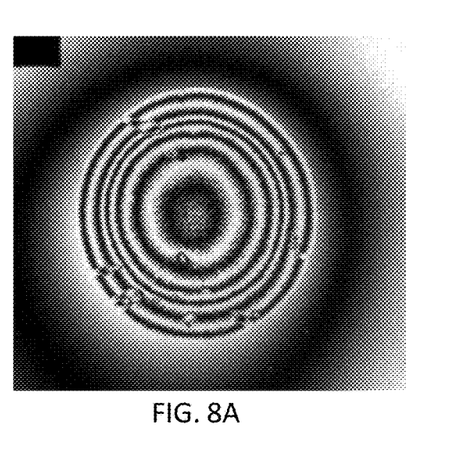
FIGS. 8A, 8B, 8C and 8D are circular dark field images of example liquid crystal rewriteable lenses upon configuration, erasure, reconfiguration, and erasure, respectively.
Figure 8B:
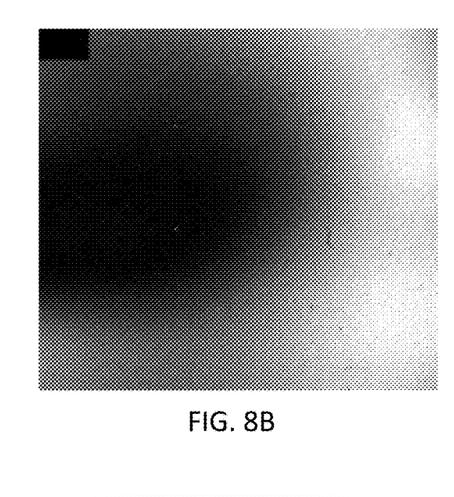
Figure 8C:
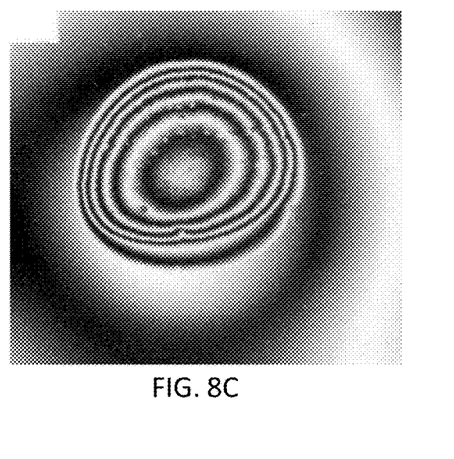
Figure 8D:
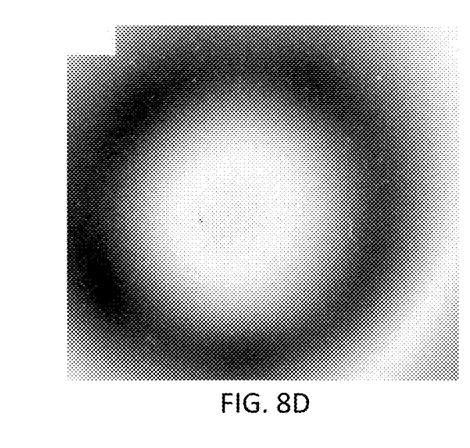

Referring now to FIG. 7A, there is shown a block diagram of a liquid crystal cell in a rewriteable lens after application of heat to the lens to erase the lens. When the lens is heated at a large enough temperature for a large enough time as denoted by the shaded area 730, the polar angle reverts to 90° and the refractive index is erased and the lens returns to its initial state as shown by the LC 710 with spatially constant refractive index. This is how the erasing in blocks 118 and 230 in FIGS. 1 and 2 is achieved. With respect to erasing times, in one example implementation, for a lens with 50 μm gap LC cells, 10 hours at 75 degrees C. may be used. In some embodiments, higher temperatures will accelerate the erasing, however caution must be used so as not to overheat the lens. FIG. 7B is a graph showing the spatial index distribution 720 of the liquid crystal lens in FIG. 7A. The spatial index distribution $n_0(X)$ is constant, as the lens is blank.

FIGS. 8A, 8B, 8C and 8D are circular dark field images of example GRIN liquid crystal lenses created upon configuration, erasure, reconfiguration, and erasure of a lens corresponding to the results of the actions taken in blocks 116, 118, 116 and 118 of FIG. 1, respectively, or blocks 214, 230, 232, 230 of FIG. 2, respectively. These images show the impact and effectiveness of the methods described herein. For example, the GRIN lens depicted in FIGS. 8A, 8B, 8C and 8D was created using an LC cell with a 51 μm gap filled with LC MCL2132 using a PMMA alignment layer. The GRIN lens was recorded using 365 nm UV light. An exposure of H=132 Jcm$^{-2}$ was used for the first state of the GRIN lens shown in FIG. 8A and of H=106 Jcm$^{-2}$ for the second written state of the GRIN lens shown in FIG. 8C. The first erasing operation resulting in the lens state shown in FIG. 8B was made heating the LC lens for 10 hours at 75° C., and the second erasing operation resulting in the lens in the state shown in FIG. 8D was achieved by heating the lens at 75° for 10 hours.

The methods described above in FIGS. 1, 2 and 3 may be achieved or controlled using a computing device such as a personal computer or computer workstation which may be coupled to a network for communication. The computing device may calculate the parameters, refractive indices, exposure patterns, and temperature to configure the rewriteable lens. The computing device may calculate measurements needed to control the equipment used to write the rewriteable lens and may also be used to control the equipment used to write refractive indices to rewriteable lenses. The computing device may control the UV light and heat used to write, rewrite, configure, reconfigure and erase rewriteable lenses.

Figure 9:
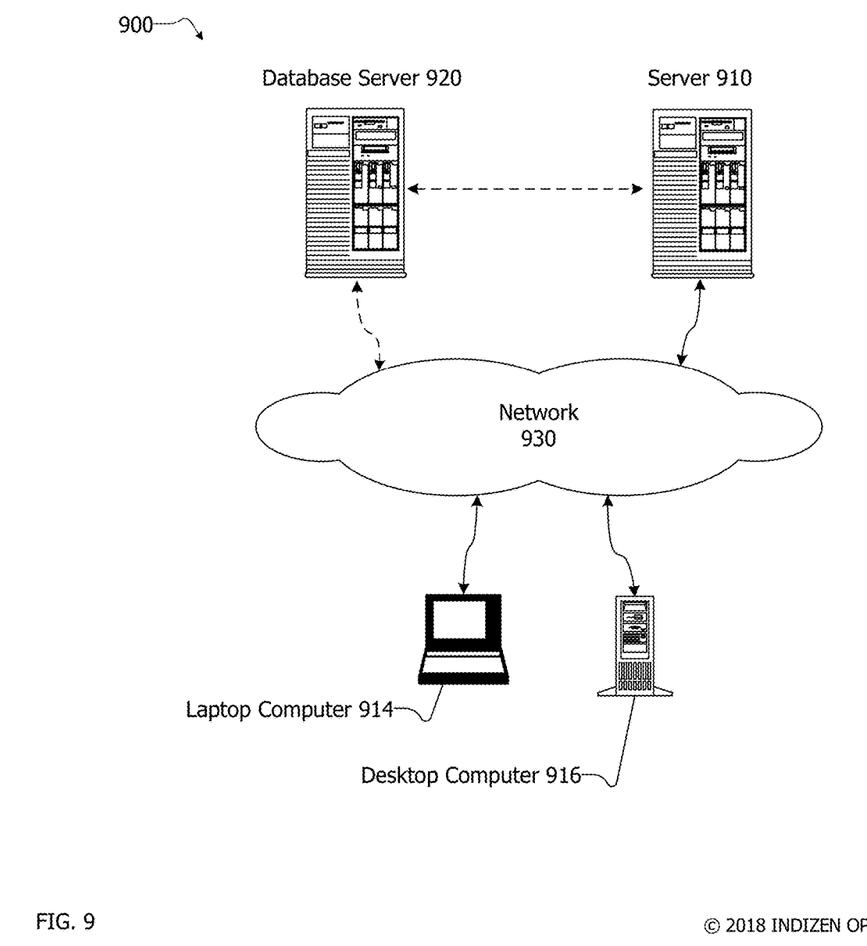
FIG. 9 is a block diagram showing a computing device and environment used to implement the methods to create and rewrite a rewriteable lens described herein.

Referring now to FIG. 9, there is shown a drawing of a computing environment 900 in which the methods may be implemented. The methods described herein may be implemented in software that is stored in and executed by a computing device. The software may control the time, temperature, angles, UV light, and other aspects and features of the methods described. A computing device as used herein refers to any device with a processor, memory and a storage device that executes instructions including, but not limited to, personal computers, desktop computers 916, server computers 910, mini-computers, mainframe computers, super computers, computer workstations, mobile devices such as computing tablets and smartphones, portable computers, and laptop computers 914. These computing devices may run an operating system, including, for example, variations of the Microsoft Windows, Linux, Android, and Apple Mac operating systems, and may include or run virtual machines.

The software is stored on a machine readable storage medium in a storage device included with or otherwise coupled or attached to a computing device. That is, the software is stored in electronic, machine readable media. These storage media include, for example, magnetic media such as hard disks; optical media such as compact disks (CD-ROM and CD-RW), digital versatile disks (DVD and DVD±RW), and BLU-RAY; silicon-based storage including solid state drives (or silicon storage devices) (SSDs) and flash memory cards; and other magnetic, optical, and silicon storage media. As used herein, a storage device is a device that allows for reading and/or writing to a storage medium. Storage devices include hard disk drives, SSDs, DVD drives, flash memory devices, and others.

The computing device may include software for providing functionality and features described herein. The computing device may include one or more of: logic arrays, memories, analog circuits, digital circuits, software, firmware, and processors such as microprocessors, field programmable gate arrays (FPGAs), application specific integrated circuits (ASICs), programmable logic devices (PLDs) and programmable logic arrays (PLAs). The components of the computing device may include specialized units, circuits, software and interfaces for providing the functionality and features described here. The processes, functionality and features described herein are embodied in whole or in part in software which operates on a computing device and may be in the form of firmware, an application program, an applet (e.g., a Java applet), a browser plug-in, a COM object, a dynamic linked library (DLL), a script, one or more subroutines, an operating system component or service, or a combination of these. The hardware and software and their functions may be distributed such that some components are performed by one computing device and others by other computing devices. The computing device may be or include or be coupled directly or over a network 930 with specialized computing devices and software such as database software and one or more database servers 920. The database servers may store lens configuration information, lens prescription information, lens creation parameters, etc. The network 930 may be a local area network (LAN), wide area network (WAN), a combination of these, and may be the Internet.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method for lens configuration comprising:
    erasing a lens comprising a rewriteable material having heat reversible Exposure-Induced Polar Alignment (EPA) by heating the lens to a defined erasure temperature;
    writing a first refractive index spatial distribution in the lens using a first exposure pattern of directed ultraviolet light to induce a reversible polar alignment of the rewritable material.

2. The method for lens configuration of claim 1 wherein the rewriteable material is selected from the group including a liquid crystal, polymer dispersed liquid crystal, a polymer stabilized liquid crystal, an encapsulated liquid crystal, a bistable liquid crystal, a polymer dispersed bistable liquid crystal, a polymer stabilized bistable liquid crystal, an encapsulated bistable liquid crystal.

3. The method for lens configuration of claim 1 further comprising
    writing a second refractive index spatial distribution in the lens using a second exposure pattern, wherein the second refractive index is different from the first refractive index.

4. The method for lens configuration of claim 3 wherein the first refractive index spatial distribution corresponds to a first refractive power distribution and the second refractive index spatial distribution corresponds to a second power distribution.

5. The method for lens configuration of claim 3 wherein the first refractive index spatial distribution corresponds to a first ophthalmic prescription of a patient and the second refractive index spatial distribution corresponds to a second ophthalmic prescription of a patient.

6. The method for lens configuration of claim 1 wherein the lens further comprises a passive material.

7. The method for lens configuration of claim 1 wherein the lens is selected from the group including spectacle lenses, face shields, eye shields, goggles, insert lenses, lenses for respirators, lenses for helmets, intraocular lenses, refractive lenses and diffractive lenses.

8. The method for lens configuration of claim 1 wherein the first exposure pattern has a spatial distribution and a temporal distribution.

9. A method for rewriteable lens creation and configuration comprising:
    creating a rewriteable lens from a specialized material including liquid crystals having heat reversible Exposure-Induced Polar Alignment (EPA)
    writing a first refractive index spatial distribution in the rewriteable lens using a first exposure pattern of UV light to induce a reversible polar alignment of the liquid crystals
    erasing the refractive index by heating the rewriteable lens to a defined erasure temperature.

10. The method for rewriteable lens creation and configuration of claim 9 further comprising
    writing a second refractive index spatial distribution in the rewriteable lens using a second exposure pattern of UV light, wherein the second refractive index is different from the first refractive index.

11. The method for rewriteable lens creation and configuration of claim 9 wherein the defined erasure temperature is from 70 to 130 degrees centigrade, inclusive.

12. The method for rewriteable lens creation and configuration of claim 9 wherein the first refractive index spatial distribution corresponds to a first refractive power distribution and the second refractive index spatial distribution corresponds to a second power distribution.

13. The method for rewriteable lens creation and configuration of claim 9 wherein the first refractive index spatial distribution corresponds to a first ophthalmic prescription of a patient and the second refractive index spatial distribution corresponds to a second ophthalmic prescription of a patient.

14. The method for rewriteable lens creation and configuration of claim 9 wherein the liquid crystals include at least one selected from the group including a liquid crystal, a polymer dispersed liquid crystal, a polymer stabilized liquid crystal, an encapsulated liquid crystal, a bistable liquid crystal, a polymer dispersed bistable liquid crystal, a polymer stabilized bistable liquid crystal, an encapsulated bistable liquid crystal.

15. The method for rewriteable lens creation and configuration of claim 9 wherein the rewritable lens further comprises a passive material.

16. The method for rewriteable lens creation and configuration of claim 9 wherein the creating includes applying a magnetic, electric or electromagnetic field to the rewriteable lens.

17. The method for rewriteable lens creation and configuration of claim 9 wherein the rewritable lens is selected from the group including spectacle lenses, face shields, eye shields, goggles, insert lenses, lenses for respirators, lenses for helmets, intraocular lenses, refractive lenses and diffractive lenses.

18. The method for rewriteable lens creation and configuration of claim 9 wherein the first exposure pattern has a spatial distribution and a temporal distribution.

19. The method for rewriteable lens creation and configuration of claim 9 wherein the erasing is achieved by heating directed to a specific region of the rewriteable lens.

20. The method for rewriteable lens creation and configuration of claim 9 wherein the heating is achieved by applying infrared radiation for a defined time period.

21. The method for rewriteable lens creation and configuration of claim 9 wherein the heating is achieved by placing the rewriteable lens in an oven for a defined time period.

* * * * *